United States Patent
Perera et al.

(10) Patent No.: US 8,901,632 B1
(45) Date of Patent: Dec. 2, 2014

(54) NON-VOLATILE MEMORY (NVM) AND HIGH-K AND METAL GATE INTEGRATION USING GATE-LAST METHODOLOGY

(71) Applicant: Freescale Semiconductor, Inc., Austin, TX (US)

(72) Inventors: Asanga H. Perera, West Lake Hills, TX (US); Cheong Min Hong, Austin, TX (US); Sung-Taeg Kang, Austin, TX (US); Byoung W. Min, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/041,662

(22) Filed: Sep. 30, 2013

(51) Int. Cl.
*H01L 21/82* (2006.01)
*H01L 21/336* (2006.01)
*H01L 29/792* (2006.01)
*H01L 29/78* (2006.01)
*H01L 29/66* (2006.01)

(52) U.S. Cl.
CPC ...... *H01L 29/7831* (2013.01); *H01L 29/66484* (2013.01); *H01L 21/82* (2013.01)
USPC ........... 257/314; 438/129; 438/261; 438/258; 438/266; 438/259; 257/324; 257/E21.422; 257/E21.423; 257/E21.662; 257/E21.409; 257/410; 257/316

(58) Field of Classification Search
CPC ................ H01L 29/792; H01L 27/115; H01L 29/42328; H01L 29/66825; H01L 29/66833; H01L 21/28282; H01L 29/42324; H01L 27/11524; H01L 29/788; H01L 27/11526; H01L 21/76802
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |

(Continued)

FOREIGN PATENT DOCUMENTS

WO 2009058486 5/2009

OTHER PUBLICATIONS

Office Action—Allowance mailed Feb. 21, 2014 in U.S. Appl. No. 13/441,426.

(Continued)

*Primary Examiner* — Marcos D. Pizarro
*Assistant Examiner* — Nelson Garces
(74) *Attorney, Agent, or Firm* — Mary Jo Bertani (57) ABSTRACT

A method of making a semiconductor structure includes forming a select gate over a substrate in an NVM region and a first protection layer over a logic region. A control gate and a storage layer are formed over the substrate in the NVM region. The control gate has a top surface below a top surface of the select gate. The charge storage layer is under the control gate, along adjacent sidewalls of the select gate and control gate, and is partially over the top surface of the select gate. A second protection layer is formed over the NVM portion and the logic portion. The first and second protection layers are removed from the logic region. A portion of the second protection layer is left over the control gate and the select gate. A gate structure, formed over the logic region, has a high k dielectric and a metal gate.

18 Claims, 10 Drawing Sheets

(56) References Cited

U.S. PATENT DOCUMENTS

| | | | |
|---|---|---|---|
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |
| 7,202,524 B2 | 4/2007 | Kim et al. | |
| 7,208,793 B2 | 4/2007 | Bhattacharyya | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny et al. | |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Shroff et al. | |
| 8,679,927 B2 | 3/2014 | Ramkumar et al. | |
| 2001/0049166 A1 | 12/2001 | Peschiaroli et al. | |
| 2002/0061616 A1 | 5/2002 | Kim et al. | |
| 2003/0022434 A1 | 1/2003 | Taniguchi et al. | |
| 2004/0075133 A1 | 4/2004 | Nakagawa et al. | |
| 2004/0262670 A1 | 12/2004 | Takebuchi et al. | |
| 2005/0145949 A1 | 7/2005 | Sadra et al. | |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1 | 2/2008 | Shimamoto et al. | |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1 | 8/2008 | Yanagi et al. | |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1* | 4/2009 | Steimle et al. | 438/261 |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0269893 A1 | 10/2009 | Hashimoto et al. | |
| 2009/0273013 A1 | 11/2009 | Winstead et al. | |
| 2009/0278187 A1 | 11/2009 | Toba | |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1 | 2/2012 | Ariyoshi et al. | |
| 2012/0104483 A1 | 5/2012 | Shroff et al. | |
| 2012/0132978 A1 | 5/2012 | Toba et al. | |
| 2012/0142153 A1 | 6/2012 | Jeong | |
| 2012/0248523 A1 | 10/2012 | Shroff et al. | |
| 2012/0252171 A1* | 10/2012 | Shroff et al. | 438/129 |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1 | 4/2013 | Ishii et al. | |
| 2013/0137227 A1 | 5/2013 | Shroff et al. | |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1 | 7/2013 | Shroff et al. | |
| 2013/0264633 A1 | 10/2013 | Hall et al. | |
| 2013/0264634 A1 | 10/2013 | Hall et al. | |
| 2013/0267072 A1* | 10/2013 | Hall et al. | 438/258 |
| 2013/0267074 A1 | 10/2013 | Hall et al. | |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |

OTHER PUBLICATIONS

Office Action—Allowance mailed Feb. 28, 2014 in U.S. Appl. No. 13/442,142.
Office Action—Allowance mailed Mar. 3, 2014 in U.S. Appl. No. 13/790,014.
Office Action—Allowance mailed Mar. 6, 2014 in U.S. Appl. No. 13/491,771.
Office Action—Allowance mailed Mar. 11, 2014 in U.S. Appl. No. 13/907,491.
Office Action—Allowance mailed Mar. 12, 2014 for U.S. Appl. No. 13/790,225.
U.S. Appl. No. 13/781,727, Office Action—Allowance, May 12, 2014.
U.S. Appl. No. 13/441,426, Shroff, M. D., et al., Office Action—Allowance, mailed Jun. 9, 2014.
U.S. Appl. No. 13/907,491, Office Action—Rejection, Sep. 3, 2013.
U.S. Appl. No. 13/343,331, Office Action—Allowance, Nov. 8, 2013.
Chen, J.H., et al., "Nonvolatile Flash Memory Device Using Ge Nanocrystals Embedded in HfA1O High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/50038110111000803.
Krishnan, S., et al.., "A Manufacturable Dual Channel (Si and SiGe) High-K Metal Gate CMOS Technology with Multiple Oxides for (56) References Cited

OTHER PUBLICATIONS

High Performance and Low Power Applications", IEEE, Feb. 2011 IEEE International Electron Devices Meeting (IEDM), 28.1.1-28.1. 4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao: P. et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.
U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a NonVolatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed. Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/781,727, Shroff, M., et al., "Methods of Making Logic Transistors and non-Volatile Memory Cells", Office Action—Restriction, Jun. 21, 2013.
Office Action mailed Jan. 31, 2014 in U.S. Appl. No. 13/781,727.
Office Action mailed Jan. 16, 2014 in U.S. Appl. No. 13/491,771.
Office Action mailed Nov. 22, 2013 in U.S. Appl. No. 13/780,591.

(56) References Cited

OTHER PUBLICATIONS

Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
U.S. Appl. No. 13/928,666, Hong, Office Action—Rejection, mailed Jul. 23, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.

* cited by examiner

NON-VOLATILE MEMORY (NVM) AND HIGH-K AND METAL GATE INTEGRATION USING GATE-LAST METHODOLOGY

BACKGROUND

1. Field

This disclosure relates generally to non-volatile memories (NVMs) and logic transistors, and more particularly, integrating NVMs with logic transistors that have high-k gate dielectrics and metal gates using a gate-last methodology.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell in a NVM region of an integrated circuit and a logic transistor in a logic region of the integrated circuit includes forming the gate structure of the NVM cell in the NVM region, including the charge storage layer, while masking the logic region. The logic gate is formed while masking the NVM region with a hard mask that is subsequently used to form sidewall spacers in the NVM region. The NVM cell(s) in the NVM region are polished along with a logic gate in the logic region. The NVM cells are protected using hard masks while the metal gate in the logic region is processed. Source/drain implants are performed simultaneously in the NVM and logic regions using the sidewall spacers as masks. This is better understood by reference to the drawings and the following written description.

Figure 1:
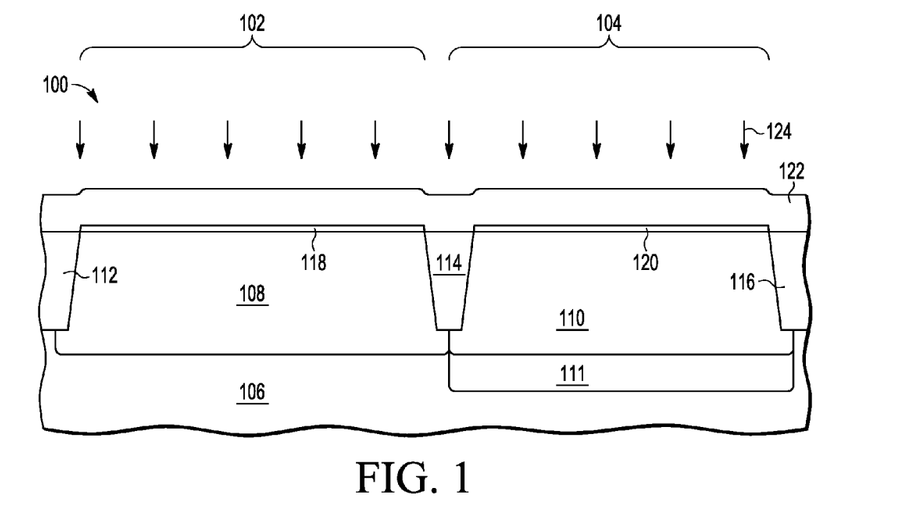
FIG. 1 is a cross section of a semiconductor structure having a non-volatile memory (NVM) structure and a logic transistor structure at a stage in processing according to an embodiment.

Shown in FIG. 1 is a semiconductor structure 100 of an integrated circuit having an NVM region 102 and a logic region 104. Semiconductor structure 100 has a substrate 106, an isolation region 114 separating logic region 104 from NVM region 102, an isolation region 112 in NVM region 102 that, along with isolation region 114, defines borders of an active region in NVM region 102, a P well 108 in substrate 106 in the NVM region 102 extending from the surface of substrate 106, a P well 110 in logic region 104 that extends from the surface of substrate 106, an N region 111 below P well 110 for aiding in providing noise isolation for the logic transistors, an oxide layer 118 on the top surface of substrate 106 in NVM region 102 and oxide or dielectric layer 120 on the top surface of substrate 106 in logic region 104. Oxide or dielectric layer 120 can be a thermal oxide that is grown, rather than deposited, for high quality electrical insulation. Isolation region 114 in logic region 104, along with isolation region 116, defines borders of an active region in logic region 104.

A layer of polysilicon 122 is deposited over oxide layers 118, 120 and isolation regions 112-116 in NVM region 102 and logic region 104. Polysilicon layer 122 may be doped in situ or by implant 124 with an N-type material for forming N-channel transistors. N wells can also be formed in other regions of logic region 104, which are not shown, for the forming P channel transistors.

The semiconductor substrate 106 described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer or dielectric layer unless otherwise noted. Similarly, nitride layer refers to a silicon nitride layer unless otherwise noted.

Figure 2:
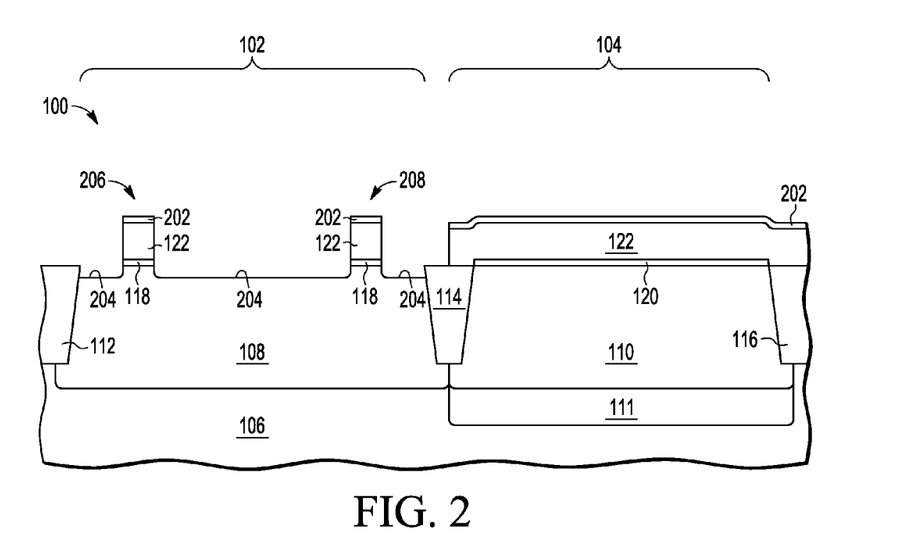
FIG. 2 is a cross section of the semiconductor structure of FIG. 1 at a subsequent stage in processing.

Shown in FIG. 2 is semiconductor structure 100 after nitride layer 202 (also referred to as an optical patterning layer or cap layer) is deposited on polysilicon layer 122 in NVM region 102 and logic region 104. Alternatively, a layer of oxide (not shown) may be deposited over polysilicon layer 122 instead of nitride layer 202.

Polysilicon layer 122 and nitride layer 202 in NVM region 102 are patterned to form select gate structures 206, 208. Patterning is typically performed using patterned photoresist and etching unmasked regions of the photoresist. Recessed portions 204 of substrate 106, also referred to as recessed trenches 204, can be formed adjacent select gate structures 206, 208 in NVM region 102 by removing regions of P well 108 in NVM region 102 during the etch.

Figure 3:
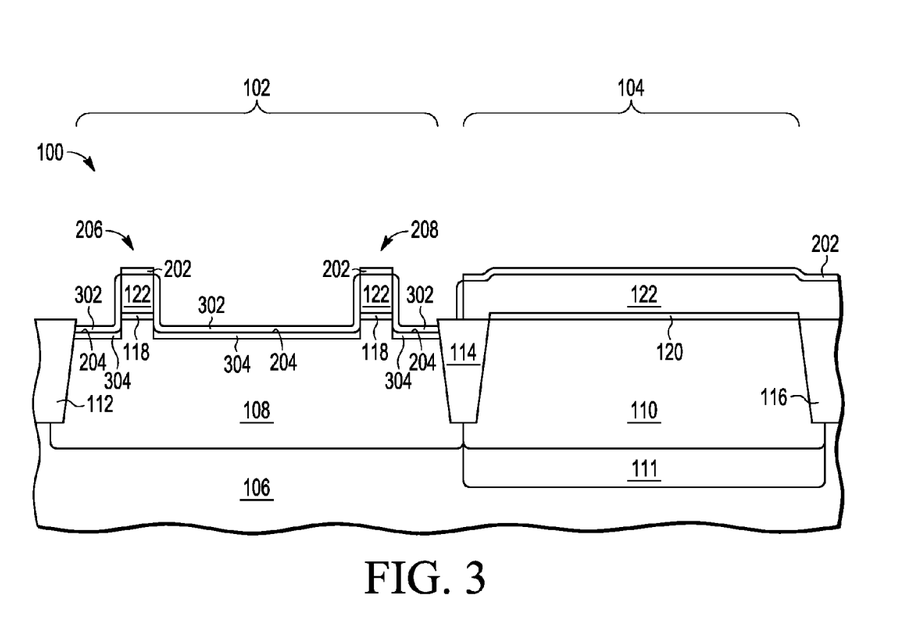
FIG. 3 is a cross section of the semiconductor structure of FIG. 2 at a subsequent stage in processing.

Shown in FIG. 3 is semiconductor structure 100 after a layer of repair oxide 302, is grown in trenches 204 before P well 108 is counterdoped in the area below trenches 204 with N-type material 304. Polysilicon layer 122 and nitride layer 202 remain in logic region 104 while select gate structures 206 and 208 are formed through counterdoping of P well 108.

Figure 4:
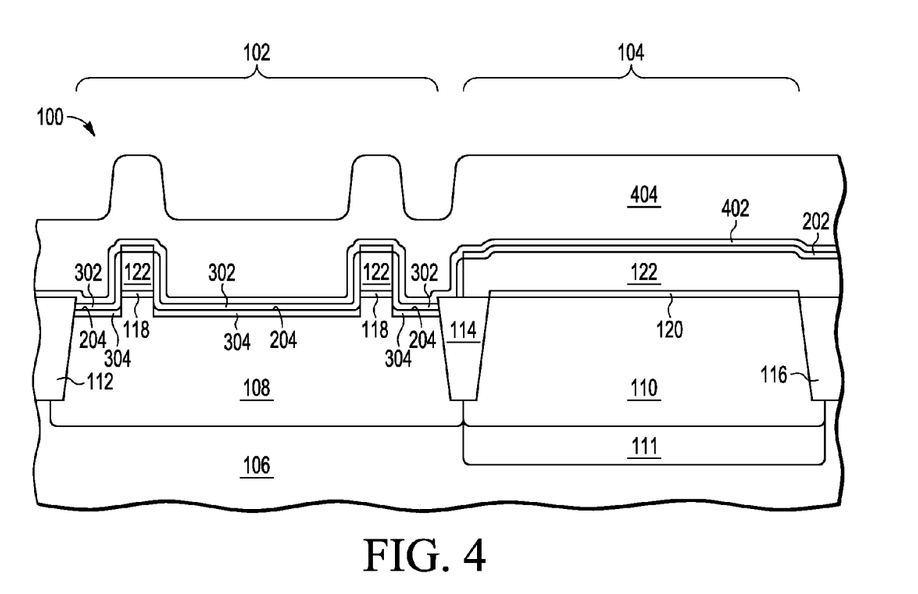
FIG. 4 is a cross section of the semiconductor structure of FIG. 3 at a subsequent stage in processing.

Shown in FIG. 4 is semiconductor structure 100 after an etch stop layer 402 and a layer of oxide 404 are conformally deposited over nitride layer 202 in NVM region 102 and logic region 104. Etch stop layer 402 can be formed of nitride or a material containing nitride.

Figure 5:
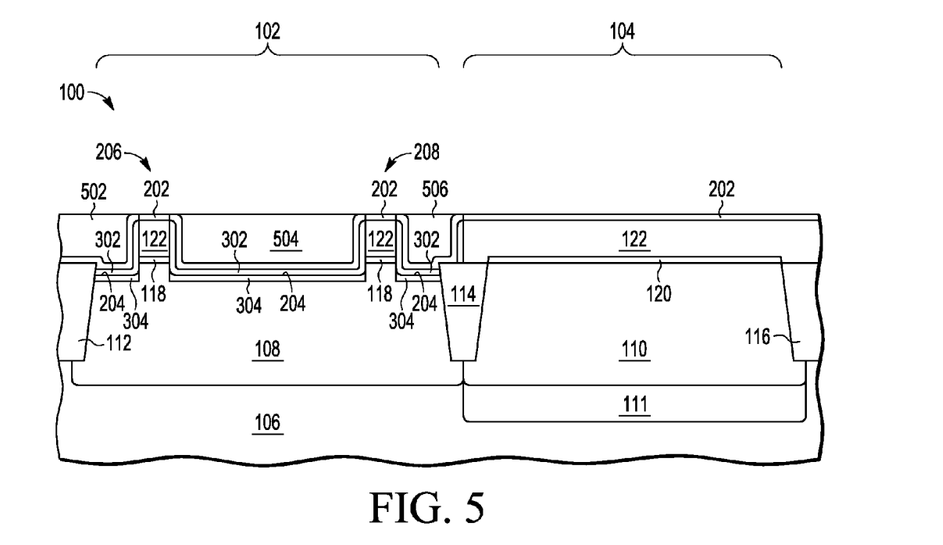
FIG. 5 is a cross section of the semiconductor structure of FIG. 4 at a subsequent stage in processing.

Shown in FIG. 5 is semiconductor structure 100 after nitride layer 202, etch stop layer 402 and oxide 404 layer are partially removed and planarized using chemical mechanical polishing (CMP). Remaining portions of etch stop layer 402 and oxide layer 404 are shown as oxide portions 502, 504, 506 adjacent select gate structures 206, 208 in NVM region 102. A portion of nitride layer 202 remains at the top of the select gate structures 206, 208 in NVM region 102 and over polysilicon layer 122 in logic region 104 after the CMP.

Figure 6:
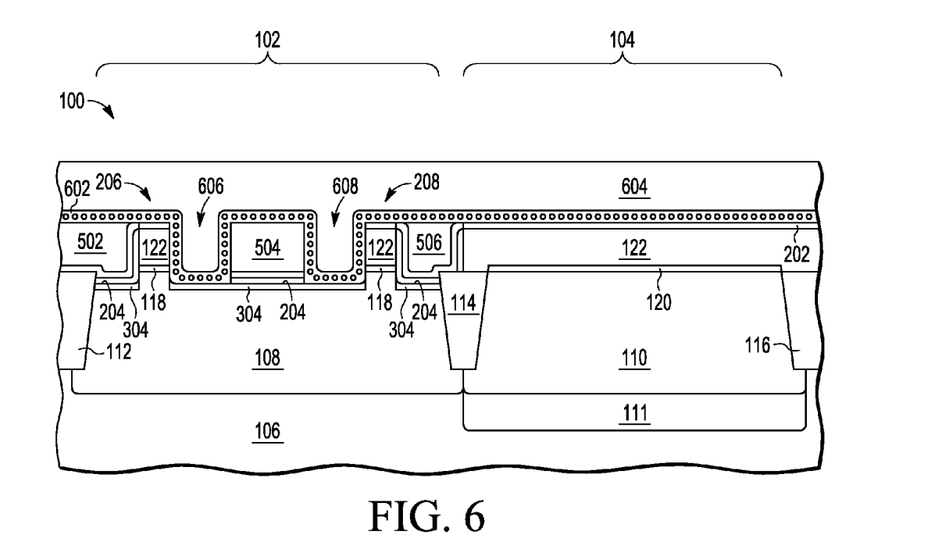
FIG. 6 is a cross section of the semiconductor structure of FIG. 5 at a subsequent stage in processing.

Shown in FIG. 6 is semiconductor structure 100 after oxide portion 504 between select gate structures 206, 208 is patterned and etched to form opening 606 between one side of oxide portion 504 and a first sidewall of select gate structure 206 and opening 608 between the another side of oxide portion 504 and a first sidewall of select gate structure 208.

Charge storage layer 602 is formed in NVM region 102 and logic region 104. Charge storage layer 602 can be formed by first growing a thermal oxide layer on the exposed top surface of structures on substrate 106 including the top and some sides of oxide portions 502, 504, 506, the top and some sides of select gate structures 206, 208 as well as over nitride layer 128 in logic region 104. This thermal oxide layer may be thinner over the nitride 202 remaining over select gate structures 206, 208 and nitride 202 remaining over polysilicon layer 122. The thermal oxide layer grown on the top surface of substrate 106 is of particular importance because that is where charge will pass during program and erase. Nanocrystals or other charge storage layer (such as a layer of nitride) are formed on the grown oxide layer and a top oxide layer is deposited on and around the nanocrystals or other charge storage layer. Polysilicon layer 604 is then deposited on charge storage layer 602.

Figure 7:
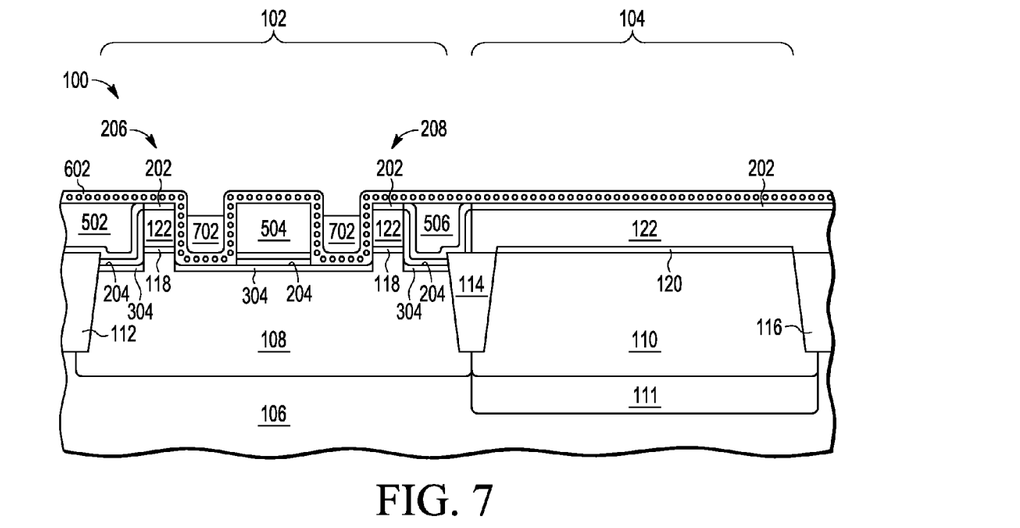
FIG. 7 is a cross section of a semiconductor structure of FIG. 6 at a subsequent stage in processing.

Shown in FIG. 7 is semiconductor structure 100 after polysilicon layer 604 is polished down to charge storage layer 602 using a chemical-mechanical polishing (CMP) process. After the CMP, control gate polysilicon regions 702 remain adjacent select gate structures 206, 208 and between regions of charge storage layer 602. Polysilicon regions 702 can be made conductive by in situ or implant doping with N-type material.

Control gate polysilicon regions 702 are recessed using an etch process. The height of control gate polysilicon regions 702 after recess etching can be below the height of polysilicon layers 122 of select gate structures 206, 208. Having the height of control gate polysilicon regions 702 below the height of select gate structures 206, 208 helps improve electrical isolation between control gate polysilicon regions 702 adjacent respective select gate structures 206, 208. This is due to the fact that any conductive artifacts remaining in the top of the oxide of charge storage layer 602 after the CMP will not form a conductive path between the top of control gate polysilicon regions 702 and respective select gate structures 206, 208. This improved isolation can be especially important during erase operations when the voltage differential between control gate polysilicon regions 702 and respective select gate structures 206, 208 can be relatively high, such as approximately 14 Volts.

Figure 8:
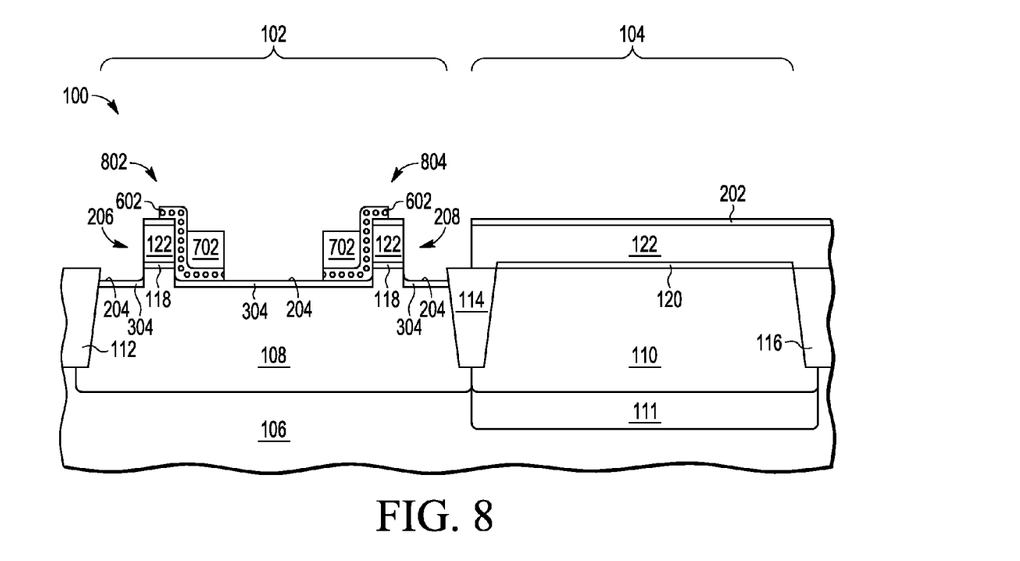
FIG. 8 is a cross section of the semiconductor structure of FIG. 7 at a subsequent stage in processing.

Shown in FIG. 8 is semiconductor structure 100 after charge storage layer 602 and oxide portions 502, 504, 506 are patterned and etched, resulting in NVM structures 802 and 804 having control gate polysilicon regions 702 partially overlapping respective select gate structures 206, 208 in NVM region 102. Remaining sections of charge storage layer 602 partially overlap respective select gate structures 206, 208 and are between select gate structures 206, 208 and respective control gate polysilicon regions 702. Charge storage layer 602 is also removed from logic region 104.

Figure 9:
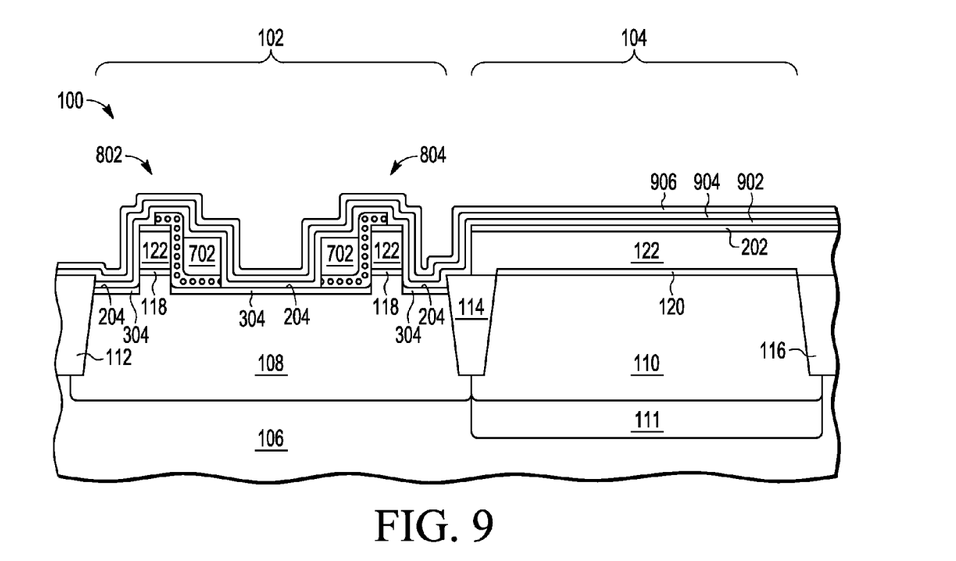
FIG. 9 is a cross section of the semiconductor structure of FIG. 8 at a subsequent stage in processing.

Shown in FIG. 9 is semiconductor structure 100 after depositing protective layers in NVM region 102 and logic region 104 including an oxide layer 902, a nitride layer 904 on oxide layer 902, and an oxide layer 906 on nitride layer 904.

Figure 10:
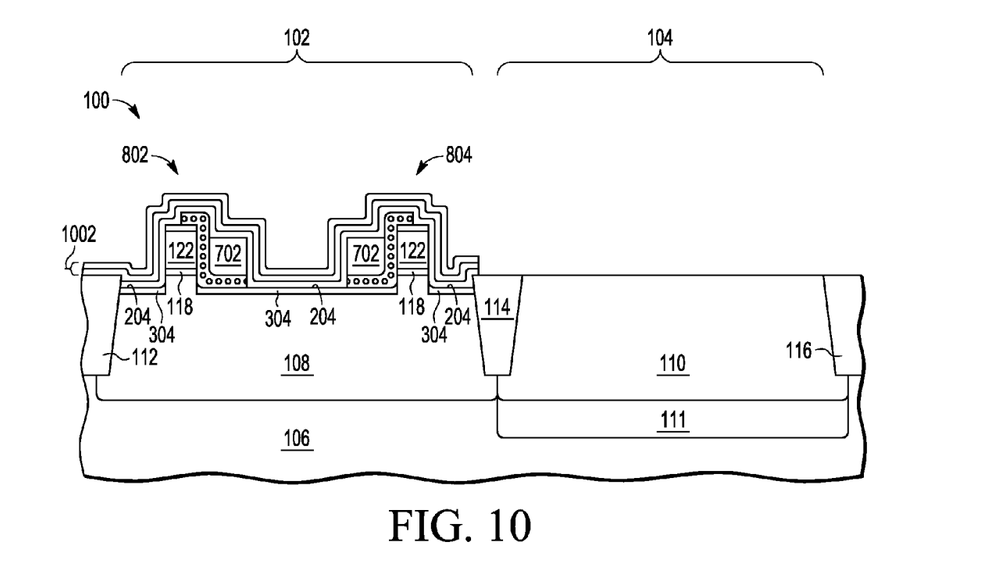
FIG. 10 is a cross section of the semiconductor structure of FIG. 9 at a subsequent stage in processing.

Shown in FIG. 10 is semiconductor structure 100 after removing protective layers 902, 904, 906, capping layer 202, polysilicon layer 122 and oxide layer 120 from logic region 104. The remaining region of protective layers 1002 over NVM region 102 functions as a hard mask for the components in NVM region 102.

Figure 11:
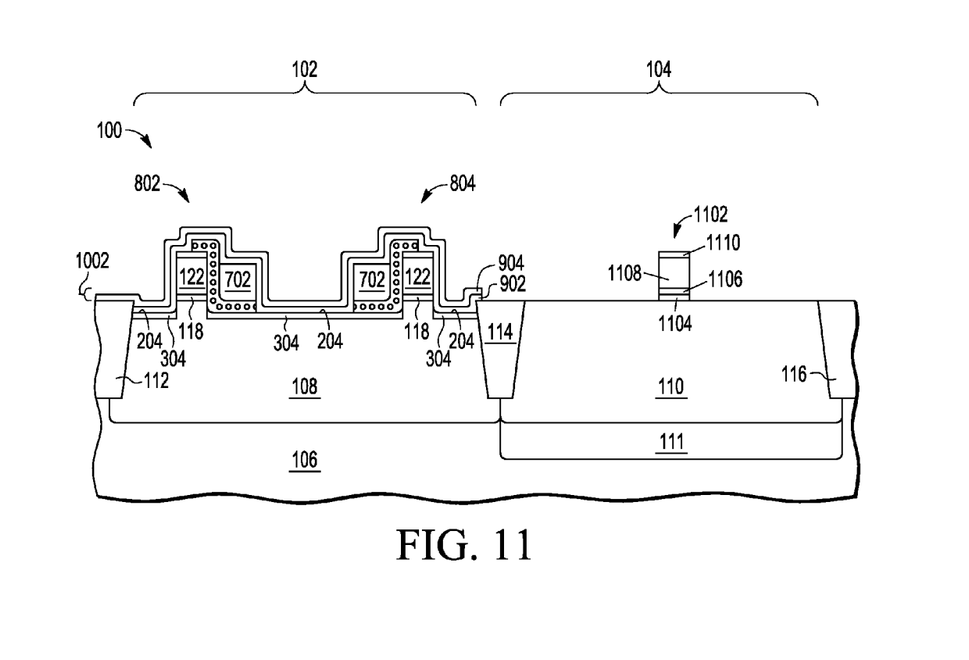
FIG. 11 is a cross section of the semiconductor structure of FIG. 10 at a subsequent stage in processing.

Shown in FIG. 11 is semiconductor structure 100 after forming a patterned logic control gate structure 1102 (also referred to as a sacrificial gate stack) in logic region 104 that includes a layer of grown oxide (not shown) over P well 110, a layer of high-k dielectric 1104 over the oxide layer, a layer of barrier metal 1106 over the high-k dielectric 1104, a layer of polysilicon 1108 (also referred to as a sacrificial control gate) over the barrier metal 1106, and a cap layer 1110 (such as a nitride) over polysilicon 1108. Oxide layer 906 is removed during the cleaning process prior to growing the oxide (not shown) beneath the high-k dielectric layer 1104. The etch of the barrier metal 1106 during the formation of logic gate structure 1102 can have the effect of metal making contact with NVM region 102, which can contaminate charge storage layer sections 602 (FIG. 6), especially if charge storage layer 602 has nanocrystals. The hard mask formed by protective layer 1002 prevents the nanocrystals or other charge storage layer or material from becoming contaminated.

Figure 12:
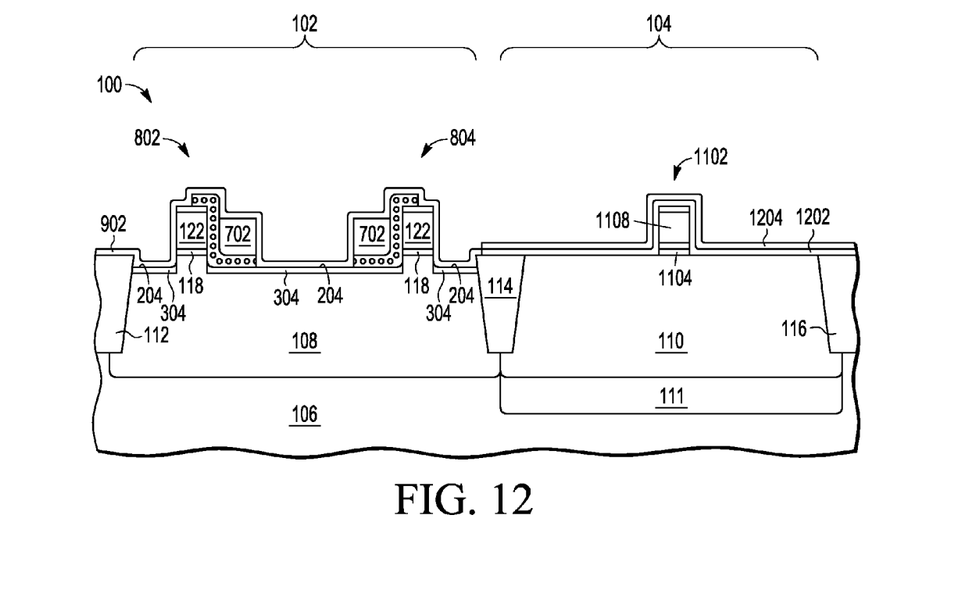
FIG. 12 is a cross section of the semiconductor structure of FIG. 11 at a subsequent stage in processing.

Shown in FIG. 12 is semiconductor structure 100 after a nitride layer 1202 and an oxide or dielectric layer 1204 is deposited on the substrate 106 over the NVM region and logic region 104. On the NVM region 102, nitride layer 1202 is deposited on nitride layer 904. Oxide layer 1204 is on nitride layer 1202. Oxide layer 1204 and nitride layer 1202 are conformal. The oxide layer 1202 is selectively removed from the NVM region 102 using a photo resist mask (not shown) to protect the logic region 104, leaving the nitride layer 904 and 1202 exposed in the NVM region 102. Nitride layers 904 and 1202 can be removed with an isotropic etch, such as a hot phosphoric acid wet etch, which etches nitride selective to oxide, while the nitride layer 1202 remains on the logic region 104 since the nitride layer 1202 is protected by oxide layer 1204 as shown in FIG. 12.

Figure 13:
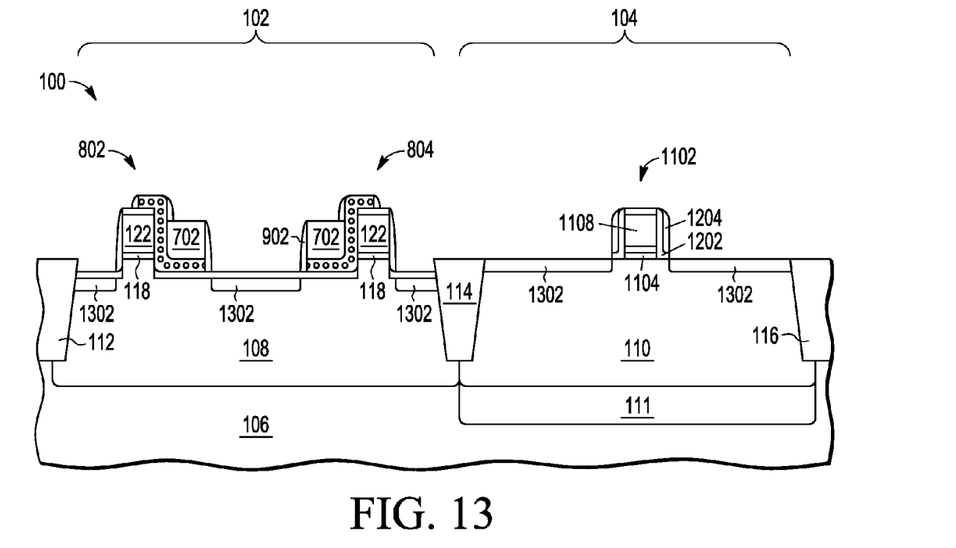
FIG. 13 is a cross section of the semiconductor structure of FIG. 12 at a subsequent stage in processing.

Shown in FIG. 13 is semiconductor structure 100 after performing an anisotropic etch of oxide layers 902, 1204 and a subsequent etch of nitride layer 1202 that results in oxide layer 902 becoming sidewall spacers 902 around respective split gate NVM structures 802, 804 in NVM region 102. Sidewall spacer 902 is adjacent to the select gate and an upper region of the control gate structure on one side and a lower region of the control gate on the other side of each NVM structure 802, 804. Sidewall spacer 902 also surrounds an upper region of the control gate on one side of NVM structures 802, 804 and is adjacent to a lower region of the control gate on one side and the select gate on the other side. After the nitride and oxide etches, nitride layer 1202 becomes sidewall spacer or liner around logic structure 1102 and oxide layer 1204 becomes sidewall spacer around liner 1202. Extension implants 1302 may be utilized to dope the substrate 106 with implant material using spacers 902, 1202, 1204 as masks.

Figure 14:
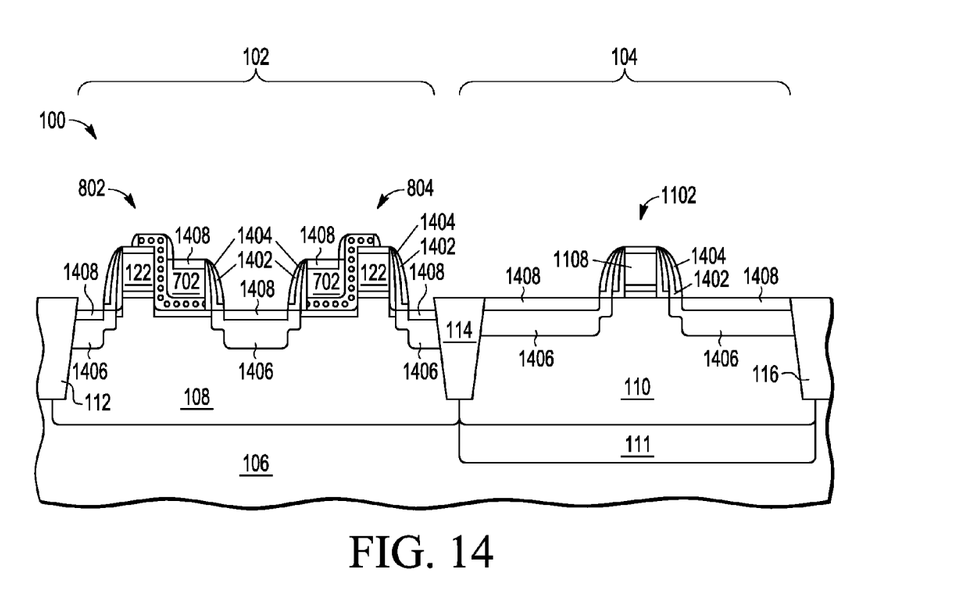
FIG. 14 is a cross section of the semiconductor structure of FIG. 13 at a subsequent stage in processing.

Shown in FIG. 14 is semiconductor structure 100 after a oxide liners 1402 are formed around NVM structures 802, 804 and logic structure 1102, and nitride spacers 1404 are formed around oxide liners 1402 of respective NVM structures 802, 804 and logic structure 1102. Source/drain implants 1406 may be formed for respective NVM structures 802, 804 and logic structure 1102 using spacers 1402, 1404 as masks. Source/drain implants 1406 are nearly aligned to opposing sides of respective NVM structures 802, 804 and logic structure 1102. The source/drain implants 1406 shown are N type. The exposed regions of source/drain implants 1406 and exposed polysilicon of select gates and control gates of respective NVM structures 802, 804 and logic structure 1102 can then be silicided to make respective low resistance contacts 1408.

Figure 15:
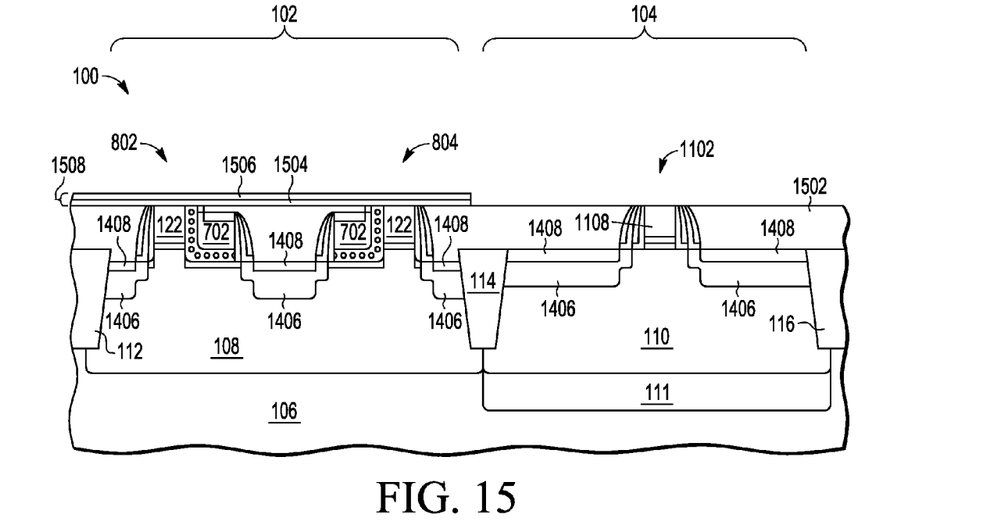
FIG. 15 is a cross section of the semiconductor structure of FIG. 14 at a subsequent stage in processing.

Shown in FIG. 15 is semiconductor structure 100 after an interlayer dielectric layer 1502 is deposited over NVM region 102 and logic region 104 and polished down using CMP to the top of select gates 122 in NVM region 102 and the top of polysilicon 1108 in logic structure 1102. Note that a portion of charge storage layer 602 overlapping select gates 122 in NVM region 102 is removed during the CMP. Additionally, note that having the top of control gate regions 702 below the top of select gate 122 improves electrical isolation between control gate regions 702 and respective select gates 122 in NVM region. This is because the top surface of control gate region 702 does get polished and thus eliminates susceptibility to control gate regions 702 to select gate region 122 electrical leakage due to conductive residual artifacts from the CMP which may conduct current between control gate regions 702 and respective select gates 122 when voltages are applied to control gate regions 702 and respective select gates 122.

After interlayer dielectric 1502 is polished, hard mask 1508 is formed over NVM region including a layer of nitride 1504 and a layer of oxide 1506.

Figure 16:
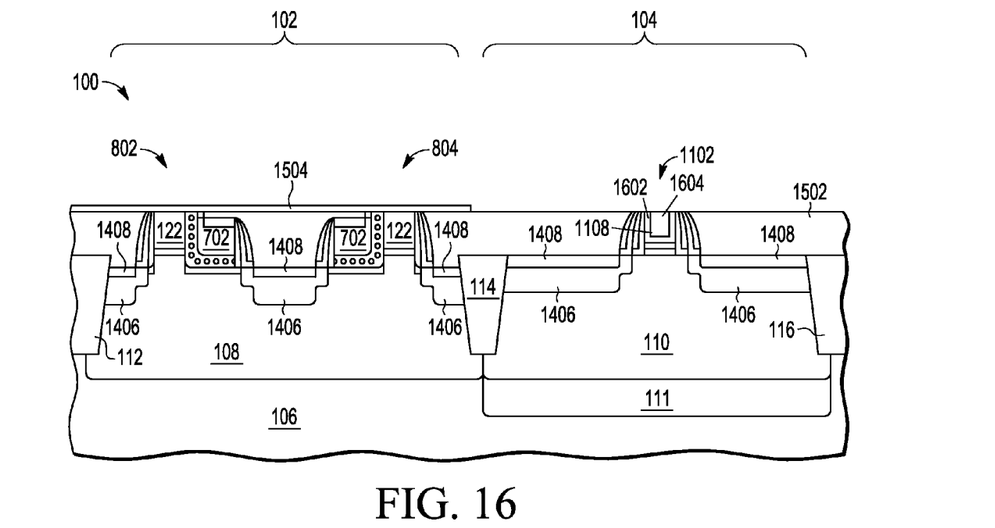
FIG. 16 is a cross section of the semiconductor structure of FIG. 15 at a subsequent stage in processing.

Shown in FIG. 16 is semiconductor structure 100 after polysilicon gate 1108 is removed from logic structure 1102 using a wet etch to form a gate opening surrounded by first spacer 1202 for logic structure 1102. A work function metal 1602 is then deposited around the sides and bottom of the gate opening in logic structure 1102. A gate metal 1604 is then deposited over the work function metal 1602 to fill the gate opening. Combinations of work function metal 1602 and the barrier metal 1106 (FIG. 11) sets the work function of N channel transistors and provides a highly conductive gate conductor in logic region 104. An alternate combination of barrier metal and work function material can be used for P channel transistors.

After gate metal 1604 is deposited in logic structure 1102, oxide layer 1506 can be removed by CMP. An additional layer of interlayer dielectric (not shown) can be deposited over nitride layer 1504 in NVM region 102 and in logic region 104. Openings (not shown) can be formed in dielectric 1502 and filled with conductive material to make contact with source/drain implants 1406 of NVM structures 802, 804 and logic structure 1102.

Figure 17:
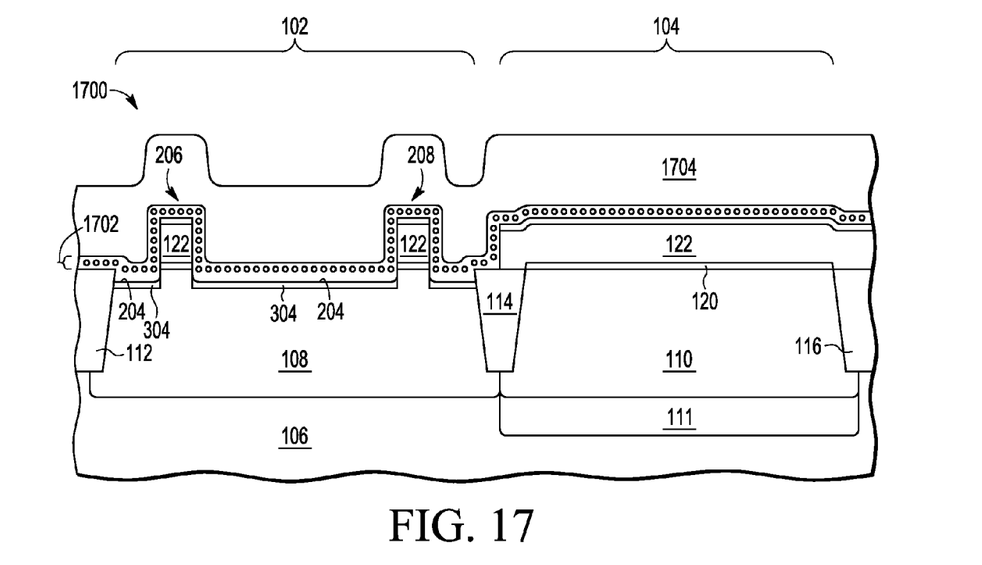
FIG. 17 is a cross section of another embodiment of a semiconductor structure having a non-volatile memory (NVM) structure and a logic transistor structure at an intermediate stage in processing according to another embodiment.

Thus it is shown that metal gate transistors can be made in the presence of NVM cells, even if the NVM cells use nanocrystals, and further that the hard mask used during the metal etch can also subsequently be used in forming sidewall spacers used as an implant mask. Other processing techniques can be used to fabricate semiconductor structure 100 instead of some of the techniques described for the embodiment of semiconductor structure 100 shown in FIGS. 1-16. As an example, FIG. 17 is a cross section of another embodiment of a semiconductor structure 1700 having non-volatile memory (NVM) region 102 and logic region 104 at an intermediate stage in processing subsequent to the processing stage shown in FIG. 3 after charge storage layer 1702 is formed in NVM region 104 and logic region 104, and a layer of polysilicon 1704 is conformally deposited over NVM region 102 and logic region 104. Charge storage layer 1702 can be similar to charge storage layer 602 (FIG. 6).

Figure 18:
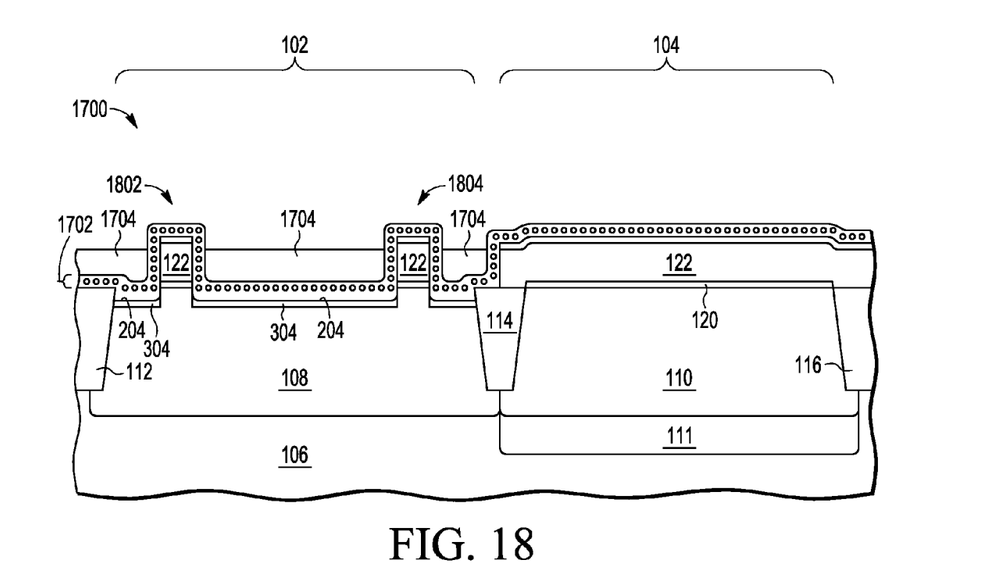
FIG. 18 is a cross section of the semiconductor structure of FIG. 17 at a subsequent stage in processing.

FIG. 18 is a cross section of the semiconductor structure 1700 of FIG. 16 at a subsequent stage in processing after polysilicon layer 1704 is reduced using a chemical mechanical polishing (CMP) process. Regions of polysilicon layer 1704 remain in NVM region 102 between isolation region 112 and select gate structure 1802, between select gate structures 1802 and 1804, and between select gate structure 1804 and polysilicon layer 122 in logic region 104. Charge storage layer 1702 is between the select gate structures 1802, 1804 and the regions of polysilicon layer 1704 and 122. The regions of polysilicon layer 1704 can be recessed below the top of polysilicon 122 of select gate structures 1802, 1804 to improve electrical isolation between polysilicon 122 and 1704.

Figure 19:
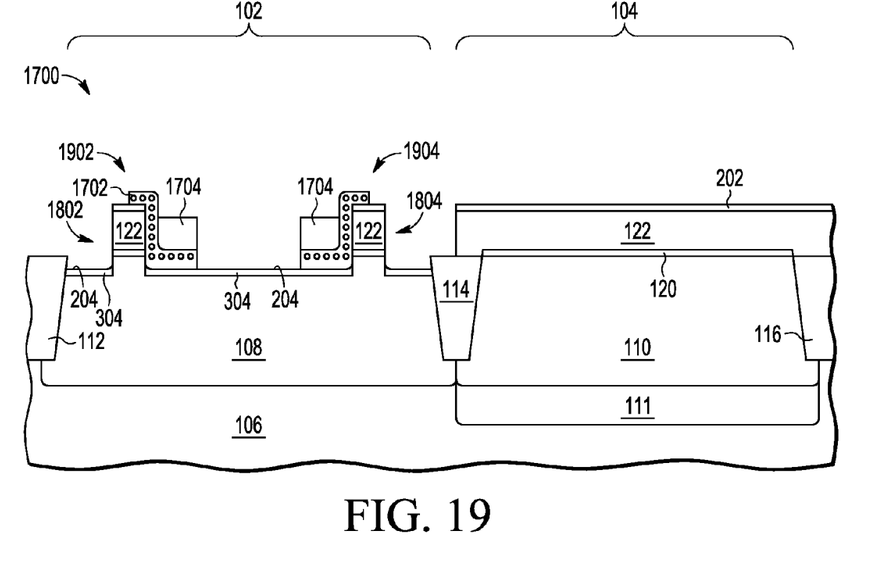
FIG. 19 is a cross section of the semiconductor structure of FIG. 18 at a subsequent stage in processing.

FIG. 19 is a cross section of the semiconductor structure 1700 of FIG. 18 at a subsequent stage in processing after a patterned etch has been performed to remove segments of polysilicon layer 1704 to form the control gates and also to remove segments of charge storage layer 1702, while leaving other segments of charge storage layer 1702 between respective select gate structures 1802, 1804 and control gates 1704. Charge storage segments 1702 overlap the top of respective select gate structures 1802, 1804 and underlie control gates 1704 adjacent substrate 106 to form completed split gate NVM cells 1902, 1904. Subsequent processing of semiconductor structure 1700 to form logic and/or I/O devices, such as logic structure 1102 (FIG. 16), in logic region 104 can follow the processes described herein for FIGS. 8 through 16.

Thus it is shown that metal gate transistors can be made in the presence of NVM cells, even if the NVM cells use nanocrystals, and further that the hard mask used during the metal etch can also subsequently be used in forming sidewall spacers used as an implant mask.

By now it should be appreciated that in some embodiments, there has been provided a method of making a semiconductor structure using a substrate (106) having a non-volatile memory (NVM) region (102) and a logic region (104), comprising: forming a select gate (206) over the substrate in the NVM region and a first protection layer (122) over the logic region; and forming a control gate (702, 1704) and a charge storage layer (602, 1702) over the substrate in the NVM region. A top surface of the control gate can be lower than a top surface of the select gate and the charge storage layer is under the control gate, along adjacent sidewalls of the select gate and control gate, is partially over the top surface of the select gate. A second protection layer (902, 904, 906) can be formed over the NVM region and the logic region. The second protection layer and the first protection layer are removed from the logic region leaving a portion of the second protection layer over the control gate and the select gate. A sacrificial gate stack (1102) can be formed over the logic region comprising a gate dielectric (1202) of high k material and a sacrificial gate (1108) over the gate dielectric. A dielectric (1502, 1402, 1404) can be formed around the sacrificial gate. The sacrificial gate is removed to leave an opening in the dielectric layer. A work function metal (1602) is formed over the gate dielectric in the opening. A metal gate (1604) is formed over the work function metal in the opening.

In another aspect, the forming the control gate and the charge storage layer can comprise forming a dielectric layer (404) over the NVM region; forming an opening in the dielectric layer adjacent to the select gate; forming the charge storage layer (602) in the opening in the dielectric layer partially filling the opening in the dielectric layer; and forming the control gate in the opening in the dielectric layer over the charge storage layer; and removing the dielectric layer.

In another aspect, the forming the control gate in the opening in the dielectric layer over the charge storage layer can be further characterized by depositing a layer of polysilicon (604) and etching back the polysilicon layer.

In another aspect, the forming the control gate and the charge storage layer can be further characterized by the charge storage layer comprising nanocrystals.

In another aspect, the forming the control gate and the charge storage layer can comprise: forming the charge storage layer over the NVM region including over the select gate; forming a polysilicon (1704) layer over the charge storage layer; etching the polysilicon layer so that a resulting top surface of the polysilicon layer can be below the top surface of the select gate; and patterning the polysilicon layer and the charge storage layer to leave a first portion of the charge storage layer adjacent to the select gate and a second portion extending laterally from the select gate and a portion of the polysilicon layer as the control gate over the second portion of the charge storage layer and adjacent to the first portion of the select gate.

In another aspect, the charge storage layer can comprise nanocrystals.

In another aspect, the method further can comprise depositing a conformal layer over NVM region and the logic region; and etching the conformal layer to leave a first sidewall spacer around the logic gate and a second sidewall spacer around the control and select gate.

In another aspect, the method further can comprise performing an implant into the substrate using the first and second sidewall spacers as masks for the implant.

In another aspect, the forming the second protection layer (1002) can comprise forming a first oxide layer (902), a nitride layer (904) on the first oxide layer, and a second oxide layer (906) on the nitride layer.

In another aspect, the step of forming the select gate and the protection layer can comprise: growing thermal oxide (118) on the substrate in NVM region; depositing a layer of polysilicon (122) over the thermal oxide; and patterning the layer of polysilicon to leave a portion of the layer of polysilicon as the select gate in the NVM region and the layer of polysilicon in the logic region as the protection layer.

In another aspect, the method further can comprise forming a capping layer (202) on the layer of polysilicon.

In another aspect, the patterning can be further characterized by patterning the capping layer with a same pattern as the layer of polysilicon is patterned.

In another aspect, the second protection layer can comprise a first layer of oxide (902), a layer of nitride (104), and a second layer of oxide (106) on the layer of nitride.

In another aspect, the forming the charge storage layer and the control gate further can comprise etching the charge storage layer to leave the top surface of the select gate partially covered with the charge storage layer.

In another embodiment, a method of making a semiconductor structure using a substrate (106) having a non-volatile memory (NVM) region (102) and a logic region (104), can comprise growing thermal oxide (118) on the substrate in the NVM region; forming a select gate (122) in the NVM region on the thermal oxide; counterdoping the substrate in the NVM region 9304) adjacent to the select gate; and forming a control gate (122) and a charge storage layer (602) over the substrate in the NVM region. A top surface of the control gate can be below a top surface of the select gate and the charge storage layer can be under the control gate, along adjacent sidewalls of the select gate and control gate, can be partially over the top surface of the select gate. A protective layer (1002) can be formed over the NVM region and the logic region. The protective layer can be removed from the logic region. A gate structure (1102) can be formed in the logic region comprising a high k dielectric (1106) as a gate dielectric and a sacrificial gate (1108) over the gate dielectric. A layer of dielectric material (1502, 1402, 1404) can be formed around the gate structure. The sacrificial gate can be removed to leave an opening in the layer of dielectric material. A work function metal (1602) can be formed in the opening.

In another aspect, the protective layer can comprise a three layer stack (902, 904, 906) comprising oxide, nitride, and oxide.

In another aspect, the forming the control gate and the charge storage layer can comprise: forming a dielectric layer (502) over the NVM region; forming an opening in the dielectric layer adjacent to the select gate; forming the charge storage layer in the opening in the dielectric layer partially filling the opening in the dielectric layer; forming the control gate in the opening in the dielectric layer over the charge storage layer; and removing the dielectric layer.

In another aspect, the forming the control gate and the charge storage layer can comprise: forming the charge storage layer over the NVM region including over the select gate; forming a polysilicon layer (1704) over the charge storage layer; etching back the polysilicon layer so that a resulting top surface of the polysilicon layer can be below the top surface of the select gate; and patterning the polysilicon layer and the charge storage layer to leave a first portion of the charge storage layer adjacent to the select gate and a second portion extending laterally from the select gate and a portion of the polysilicon layer as the control gate over the second portion of the charge storage layer and adjacent to the first portion of the select gate.

In another aspect, the forming the layer of dielectric material can comprise forming a first sidewall spacer (1602) around the gate stack and forming an interlayer dielectric around the first sidewall spacer.

In still further embodiments, a semiconductor structure using a substrate having a non-volatile memory (NVM) region (102) and a logic region (104) can comprise a select gate (122) comprising polysilicon over a thermal oxide layer (118) on the substrate (106) in the NVM region; a control gate (702) adjacent a first side of the select gate and having a top surface below a top surface of the select gate; a charge storage layer (602) having a first portion between the control gate and the substrate, a second portion between the control gate and the first side of the select gate, and a third portion partially over the select gate; and a logic gate (1602, 1604) comprising metal over a high k dielectric (1204) over the substrate in the logic region.

In another aspect, the logic gate can comprise a work function metal (1602) over the high k dielectric and a gate metal (1604) over the work function metal different from the work function metal.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate having a non-volatile memory (NVM) portion and a logic portion, comprising:
    forming a select gate over the substrate in the NVM portion and a first protection layer over the logic portion;
    forming a control gate and a charge storage layer over the substrate in the NVM portion, wherein a top surface of the control gate is lower than a top surface of the select gate and the charge storage layer is under the control gate, along adjacent sidewalls of the select gate and control gate, is partially over the top surface of the select gate;
    forming a second protection layer over the NVM portion and the logic portion;
    removing the second protection layer and the first protection layer from the logic portion leaving a portion of the second protection layer over the control gate and the select gate;
    forming a sacrificial gate stack over the logic portion comprising a gate dielectric of high k material and a sacrificial gate over the gate dielectric;
    forming a dielectric around the sacrificial gate;
    removing the sacrificial gate to leave an opening in the dielectric layer;
    forming a work function metal over the gate dielectric in the opening; and
    forming a metal gate over the work function metal in the opening.

2. The method of claim 1, wherein the forming the control gate and the charge storage layer comprises:
    forming a dielectric layer over the NVM region;
    forming an opening in the dielectric layer adjacent to the select gate;
    forming the charge storage layer in the opening in the dielectric layer partially filling the opening in the dielectric layer; and
    forming the control gate in the opening in the dielectric layer over the charge storage layer; and
    removing the dielectric layer.

3. The method of claim 2, wherein the forming the control gate in the opening in the dielectric layer over the charge storage layer is further characterized by depositing a layer of polysilicon and etching the polysilicon layer.

4. The method of claim 3, wherein the forming the control gate and the charge storage layer is further characterized by the charge storage layer comprising nanocrystals.

5. The method of claim 1, wherein the forming the control gate and the charge storage layer comprises:
    forming the charge storage layer over the NVM region including over the select gate;
    forming a polysilicon layer over the charge storage layer;
    etching the polysilicon layer so that a resulting top surface of the polysilicon layer is below the top surface of the select gate; and
    patterning the polysilicon layer and the charge storage layer to leave a first portion of the charge storage layer adjacent to the select gate and a second portion extending laterally from the select gate and a portion of the polysilicon layer as the control gate over the second portion of the charge storage layer and adjacent to the first portion of the select gate.

6. The method of claim 1, further comprising:
    depositing a conformal layer over NVM portion and the logic portion; and
    etching the conformal layer to leave a first sidewall spacer around the logic gate and a second sidewall spacer around the control and select gate.

7. The method of claim 6, further comprising performing an implant into the substrate using the first and second sidewall spacers as masks for the implant.

8. The method of claim 7, wherein the forming the second protection layer comprises forming a first oxide layer, a nitride layer on the first oxide layer, and a second oxide layer on the nitride layer.

9. The method of claim 1, wherein the step of forming the select gate and the protection layer comprises:
    growing thermal oxide on the substrate in NVM region;
    depositing a layer of polysilicon over the thermal oxide;
    patterning the layer of polysilicon to leave a portion of the layer of polysilicon as the select gate in the NVM region and the layer of polysilicon in the logic region as the protection layer.

10. The method of claim 9, further comprising forming a capping layer on the layer of polysilicon.

11. The method of claim 10, wherein the patterning is further characterized by patterning the capping layer with a same pattern as the layer of polysilicon.

12. The method of claim 1, wherein the second protection layer comprises a first layer of oxide, a layer of nitride, and a second layer of oxide on the layer of nitride.

13. The method of claim 1, wherein the forming the charge storage layer and the control gate further comprises etching the charge storage layer to leave the top surface of the select gate partially covered with the charge storage layer.

14. A method of making a semiconductor structure using a substrate having a non-volatile memory (NVM) region and a logic region, comprising:
    growing thermal oxide on the substrate in the NVM portion;
    forming a select gate in the NVM portion on the thermal oxide;
    counterdoping the substrate in the NVM portion adjacent to the select gate;
    forming a control gate and a charge storage layer over the substrate in the NVM portion, wherein a top surface of the control gate is below a top surface of the select gate and the charge storage layer is under the control gate, along adjacent sidewalls of the select gate and control gate, is partially over the top surface of the select gate;
    forming a protective layer over the NVM portion and the logic portion;
    removing the protective layer from the logic portion;
    forming a gate structure in the logic portion comprising a high k dielectric as a gate dielectric and a sacrificial gate over the gate dielectric;
    forming a layer of dielectric material around the gate structure;
    removing the sacrificial gate to leave an opening in the layer of dielectric material; and
    forming a work function metal in the opening.

15. The method of claim 14, wherein the protective layer comprises a three layer stack comprising oxide, nitride, and oxide.

16. The method of claim 14, wherein the forming the control gate and the charge storage layer comprises:
    forming a dielectric layer over the NVM region;
    forming an opening in the dielectric layer adjacent to the select gate;
    forming the charge storage layer in the opening in the dielectric layer partially filling the opening in the dielectric layer;
    forming the control gate in the opening in the dielectric layer over the charge storage layer; and
    removing the dielectric layer.

17. The method of claim 1, wherein the forming the control gate and the charge storage layer comprises:
    forming the charge storage layer over the NVM region including over the select gate;
    forming a polysilicon layer over the charge storage layer; and
    etching back the polysilicon layer so that a resulting top surface of the polysilicon layer is below the top surface of the select gate; patterning the polysilicon layer and the charge storage layer to leave a first portion of the charge storage layer adjacent to the select gate and a second portion extending laterally from the select gate and a portion of the polysilicon layer as the control gate over the second portion of the charge storage layer and adjacent to the first portion of the select gate.

18. The method of claim 14, wherein the forming the layer of dielectric material comprises forming a first sidewall spacer around the gate stack and forming an interlayer dielectric around the first sidewall spacer.

* * * * *